United States Patent [19]

Bartles

[11] 4,224,606
[45] Sep. 23, 1980

[54] FLUID LEVEL DETECTOR TEST SWITCH
[75] Inventor: James I. Bartles, Hudson, Wis.
[73] Assignee: Honeywell Inc., Minneapolis, Minn.
[21] Appl. No.: 22,581
[22] Filed: Mar. 21, 1979
[51] Int. Cl.³ .............. G08B 29/00; G01R 27/02; G01F 23/00; H01N 47/12
[52] U.S. Cl. .............. 340/514; 340/603; 340/612; 340/616; 340/620; 324/65 P; 307/116; 361/178; 73/290 R; 73/304 R; 137/392; 200/61.2
[58] Field of Search .............. 340/514, 515, 516, 603, 340/606, 620, 612, 616; 73/290 R, 304 R; 324/65 P; 137/392; 361/178; 200/61.2; 307/116, 118; 116/109

[56] References Cited
U.S. PATENT DOCUMENTS

| 3,593,270 | 7/1971 | Walker | 340/620 |
| 3,683,347 | 8/1972 | Melone | 340/515 |
| 3,834,357 | 9/1974 | Kaczmarek et al. | 122/504 |
| 4,007,713 | 2/1977 | De Leonardis et al. | 122/504 |
| 4,027,172 | 5/1977 | Hamelink | 340/620 |
| 4,053,874 | 10/1977 | Glaser | 340/515 |

Primary Examiner—John W. Caldwell, Sr.
Assistant Examiner—Donnie L. Crosland
Attorney, Agent, or Firm—Alfred N. Feldman

[57] ABSTRACT

A fluid level control circuit with a safety test function for a boiler water level probe of a fail safe type is connected to a field effect transistor controlled amplifier having a well defined threshold of operation. A safety test switch means is provided to pull the amplifier's input down below the threshold point, but not to a shorted condition. By observing the output of the system it is possible to determine whether the fluid level detector is properly installed, and whether the amplifier has had any type of unsafe operating failure.

12 Claims, 2 Drawing Figures

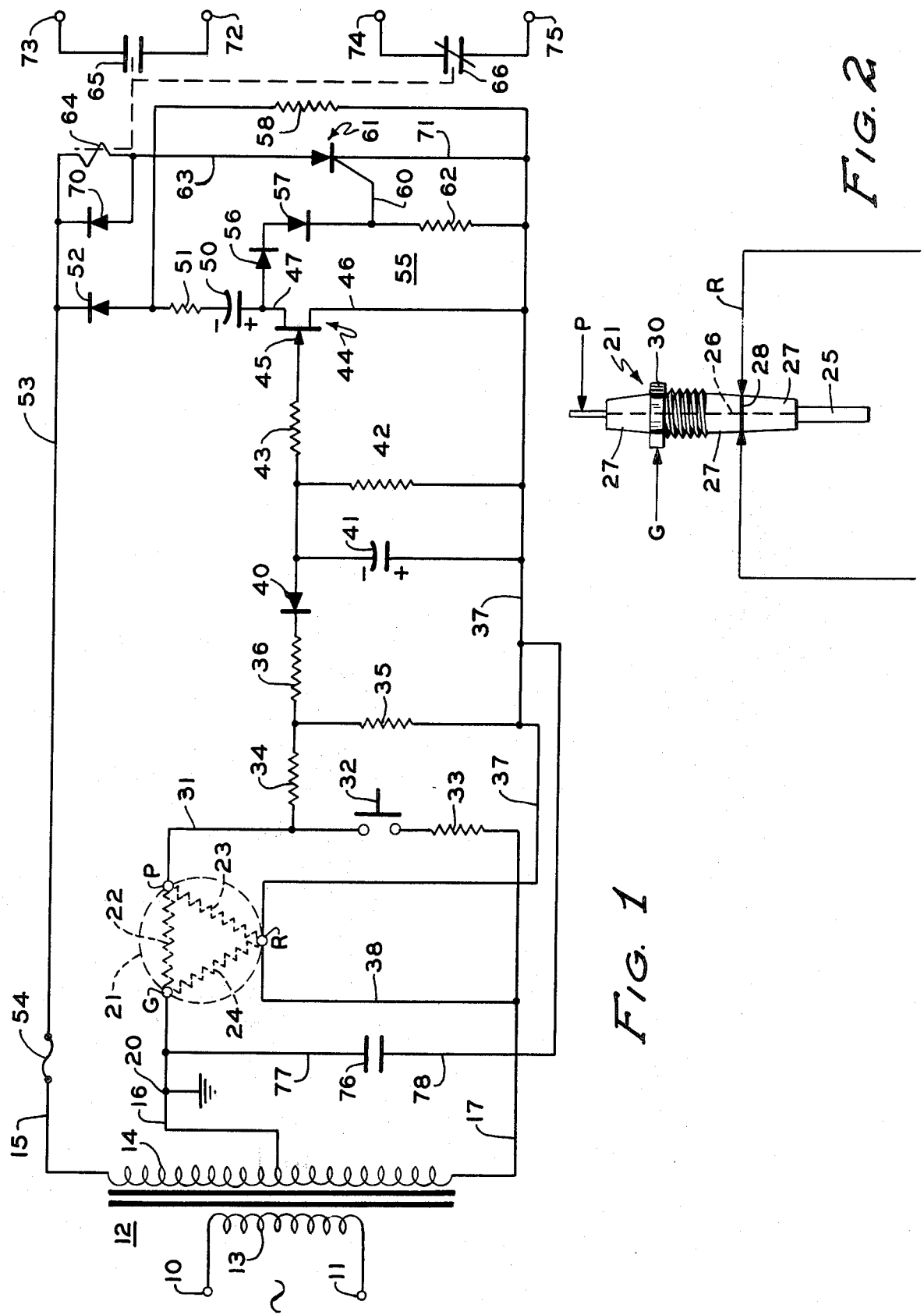

FLUID LEVEL DETECTOR TEST SWITCH

BACKGROUND OF THE INVENTION

Fluid processing systems that utilize fluid detecting probes have been in use in many fields. One of the more common types of fluid processing systems using a fluid detecting probe is a fuel burner type system in which a boiler is heated to generate hot water or steam for either heating or use in a manufacturing process. Normally the fluid sensing probe is a water level detector in the form of a metallic probe that is electrically insulated from the container or boiler. A conductive circuit is established between the probe itself and the fluid or water in the boiler to establish whether the fluid is at a proper level. In boiler water applications it is very common for the minerals in the water to form on the probe itself, and these minerals can change the characteristics of the probe in such a manner as to create an unsafe type of condition.

In order to monitor the condition of the probe and the water in a boiler some of the prior art systems have utilized test switches. In one prior art application the test switch removes the probe from the circuit and replaces it with an indicator light. The light functions to indicate whether or not a complete circuit exists through the probe to the water and then to the boiler itself. A further type of prior art test device utilizes a multiple contact switch which places an indicator light across the impedance of the probe and the boiler. If the probe was shorted out, the light will not be activated. If the probe is not shorted out, the impedance across the probe to the boiler ground acts to energize the light and indicates a safe condition.

In the systems just described electronic amplifiers are not utilized to improve the sensitivity of the system. The test switch functions previously described would monitor only the condition of the probe itself and would not reflect on the status of the overall system.

In the prior art, in order to provide a more reliable and fail safe type of system, a three element probe has been developed and is fully disclosed and described in the U.S. Pat. No. 4,027,172 to William B. Hamelink, and assigned to the assignee of the present invention. This three element type probe provides for a substantially fail safe type of boiler water monitoring system. While the probe itself is basically fail safe, there are certain types of installation conditions or faults which, if they exist, could mislead the user into the belief that the system was operating properly. Also, if the probe is used with an amplifier, there is no means disclosed in the prior art to verify the status of the amplifier as opposed to the probe itself.

SUMMARY OF THE INVENTION

The present invention is directed to the use of a boiler water or conductive fluid probe with an amplifier and a test switch. The amplifier utilized with the probe is an amplifier having a defined threshold operating level. The test switch functions at the input of the amplifier means to pull down the voltage at the input to a point below the voltage which would naturally occur if the probe were sensing a fluid. The point to which the voltage is pulled down is maintained at some value above a short circuit so that if the probe itself acts as a short circuit this unsafe condition can also be detected.

With the device of the present invention, it is possible to provide a simple test switch which can be used in a boiler water probe installation and which can monitor both for unsafe failures in the amplifier circuit and unsafe conditions at the probe. The present invention provides a single test switch that allows for a pull down of the amplifier input voltage when water is in the boiler. If the switch is operated and the output relay drops out, the system is considered to be normal. If the switch is operated and the relay does not drop out, there is an indication that the amplifier itself has failed in an unsafe manner. If the probe itself is shorted directly to the ground of the boiler, this unsafe type of installation can also thus be detected.

It is thus apparent that a simple test switch configuration is capable of providing monitoring functions not available in the prior art devices.

A BRIEF DESCRIPTION OF THE DRAWING

FIG. 1 is a schematic representation of a power source, probe, and amplifier for a boiler water installation, and;

FIG. 2 is a pictorial representation of a three element boiler water probe.

DESCRIPTION OF THE PREFERRED EMBODIMENT

In FIG. 1 there is disclosed a complete fluid level detection system which incorporates the inventive control circuit and its safety test function. While the disclosed system could be any type of fluid level detecting arrangement, the system will be specifically described as a boiler water level testing system for control of a fuel burner that heats the water in the boiler. This type of system is used extensively for heating and for process control.

In FIG. 1 there is disclosed a complete boiler water control system which is energized at terminals 10 and 11 from a conventional source of alternating current. A stepdown transformer 12 which forms a power source means is connected to the terminals 10 and 11 and has a primary winding 13, and a tapped secondary winding 14. The tapped secondary winding 14 has three output conductors 15, 16 and 17. The voltage appearing between the conductors 16 and 17 is approximately 8 volts and the total output voltage between the conductors 15 and 17 is 24 volts. By utilizing a low voltage configuration the benefits of low voltage wiring and control are obtained.

The conductor 16 is grounded at 20 and is in turn connected to a probe or fluid level detector means 21. The fluid level detecting means 21 has been disclosed as a three element device of the type disclosed in the Hamelink U.S. Pat. No. 4,027,172. The probe 21 is grounded at G and has an active probe element P. When the probe 21 is immersed in the water in a boiler, a resistance path disclosed at 22 develops between the terminals G and P and varies in resistance between approximately 10 ohms and 50,000 ohms. A typical boiler water installation would have water which would generate a resistance that is in the neighborhood of 100 ohms.

The probe or level detection means 21 has a further element R. The element R is a small ring which is intermediate the probe and a ground structure. The ring R is of relatively small cross section and the resistance between ring R and the probe P shown at 23 is quite high due to the small cross sectional area of the ring R. A further resistance path 24 is developed between the ground G and ring R and has been disclosed at 24. The resistance 24 is connected across the transformer secondary and therefore its value is not material. The operational characteristics of the fluid level detection means 21 and details of its construction can be found in the previously mentioned Hamelink patent. Only a brief further description will be provided at this point.

In FIG. 2 the fluid level detector means 21 is disclosed pictorially. The probe element itself is disclosed at 25 and is a metal rod that is electrically connected by a central conductor 26 to the probe P through three insulated members 27. The two lower insulated members 27 are separated by a conductive ring 28 which has been designated as R. The upper insultated members 27 electrically insulate a ground member 30 that typically would be in the form of a threaded plug-like member which can be screwed into the side or an opening in a water boiler. As has been previously indicated the structural details can be found in the Hamelink patent, but it should be understood that the probe 25 is electrically connected to P and is electrically insulated from the balance of the elements. The ring 28 forms a guard ring to electrically establish the ring R that is used in the fail safe operation, along with the ground plug 30 shown at G. When the ground G, the probe P, and ring R are immersed in water or conductive liquid the three resistances 22, 23 and 24 are formed in a delta configuration of resistances. After the interconnection of this probe has been disclosed with the balance of the circuit, its operation will be amplified.

The probe P is electrically connected at 31 to a normally open test switch 32 that is connected through an impedance 33 to the conductor 17. The impedance 33 is disclosed as a simple resistor, but can be any type of a voltage dropping means or impedance. The conductor 31 is connected by a resistor 34 to a further resistor 35 and a resistor 36. The resistor 35 at its lower end is connected to a conductor 37 that is connected in turn to the guard ring R. The guard ring R is further connected by conductor 38 to the conductor 17 of the secondary winding of the power source means 12.

The resistor 36 is connected through a diode 40 and a capacitor 41 to the conductor 37 which is a common conductor for the circuitry. Connected across the capacitor 41 is a bleed resistor 42. The bleed resistor 42 at its upper end is connected to a further resistor 43 that in turn is connected to a field effect transistor generally disclosed at 44. The field effect transistor 44 has a gate 45 and a pair of drain source connections 46 and 47. The input means for the field effect transistor 44 is between the gate 45 and the source 46. The source 46 is connected to the common conductor 37 so that the input circuit means between the gate 45 and the source 46 is common to the general input means for the field effect transistor 44 and effectively is connected across the switch 32 and impedance 33 which form the test switch means for the present invention.

The drain 47 of the field effect transistor 44 is connected through a capacitor 50 to a resistor 51 and a diode 52 to a conductor 53. The conductor 53 is connected through a fuse 54 to the conductor 15 of the power source means 12. The conductor 53 provides an alternating current to the field effect transistor 44 which is the amplifying element of an amplifier means generally disclosed at 55. The amplifier means 55 has a threshold operating level that is established by the potential needed between the gate 45 and the source 46 of the field effect transistor 44. This voltage typically is a negative 3.5 volts.

The circuitry further encompasses a pair of diodes 56 and 57 which form a voltage dropping means to a gate 60 of a silicon controlled rectifier generally disclosed at 61. The gate 60 is connected by a resistor 62 to the conductor 37 so that whenever current is driven through the diodes 56 and 57 to the resistor 62, the gate 60 receives a sufficient potential to cause a silicon controlled rectifier 61 to conduct. The silicon controlled rectifier 61 has its anode connected by conductor 63 to a relay means 64 that has a normally open relay contact 65 and normally closed relay contact 66. The relay 64 is paralleled by a free wheeling diode 70 in a conventional manner. The silicon controlled rectifier 61 has its circuit completed by the cathode being connected at 71 to the conductor 37. A resistor 58 is connected from conductor 37 to resistor 51 to provide a complete discharge path for capacitor 50. The relay 64 utilizes the contact 65 to control a load, such as a fuel burner, which could be connected across the terminals 72 and 73. The normally closed contact 66 is adapted to control an alarm between the terminals 74 and 75. It is apparent that whenever the load is energized, the alarm contact 66 is open to eliminate any possible alarm function. Whenever the load contact to the burner at 65 is open, the alarm contact 66 is closed to call attention to the fact that the burner has been deenergized. The overall circuitry is completed by the addition of a capacitor 76 which is connected by a conductor 77 to the ground at 20 and by conductor 78 to the conductor 37. The capacitor 76 is used to shunt transients out of the power source means 12 so that they do not effect the operation of the overall device.

OPERATION

If it is assumed that electric power is supplied to the terminals 10 and 11, and that there is water in the boiler to which the probe 21 is exposed, the resistances 22, 23 and 24 exist with the resistance 22 equaling typically 100 ohms. As has been previously indicated, this value could range from 10 ohms to approximately 50,000 ohms but a typical boiler would have a 100 ohm resistance. The resistance 23 would be quite high due to the small cross sectional area of the ring R, and resistance 24 is not material to the operation.

With power supplied to the transformer or power source means 12, approximately 8 volts appears at conductor 16 with approximately 24 volts appears at conductor 15 with respect to the conductor 17. The potential on conductor 15 is supplied through the fuse 54 and conductor 53 to the relay 64. At any time that the silicon controlled rectifier 61 conducts, half wave energy is supplied to the relay coil 64 to energize the relay. Once the relay is energized it will remain energized during the next half cycle by the action of the free wheeling diode 70. It is thus apparent that half wave energization of the relay 64 is all that is required of the silicon controlled rectifier 61. The manner in which the silicon controlled rectifier 61 is gated into operation will be described in connection with the balance of the system.

The 8 volts appearing on the conductor 16 forms the ground at 20 and is connected to the G terminal of the probe means 21. This is a normally threaded member that mounts the probe 21 into a boiler. This 8 volt potential is supplied through the relatively small resistance 22 to the conductor 31. When the conductor 17 is positive with respect to the ground or conductor 16, current is drawn through the conductor 17, the conductor 38, and to the conductor 37 where current flows to the capacitor 41 and is rectified by the diode 40 to provide a charge across the capacitor 41 of the polarity marked. The negative voltage across the capacitor 41 is applied through the resistor 43 to the gate 45 of the field effect transistor 44. When the conductor 37 is positive with respect to the conductor 53, current flows in the field effect transistor 44 to charge the capacitor 50 with a polarity as shown. The current is drawn through the resistor 51 and the diode 52 to the conductor 53.

Without a bias potential on the gate 45 of the field effect transistor 44, the field effect transistor 44 acts as an impedance which is capable of conducting from the source 46 to the drain 47, and then again back from the drain 47 to the source 46. With this type of action, the capacitor 50 charges and discharges through the field effect transistor rather than resistance 62 because the field effect transistor is a low impedance. With a potential as shown across the capacitor 41 applied to the gate 45, the field effect transistor 44 is allowed to conduct from the source 46 to the drain 47 charging the capacitor 50 with the polarity as shown. When the power source means 12 reverses its polarity so that conductor 53 is positive with respect to conductor 37, the voltage appearing across the capacitor 41 and connected to the gate 45 keeps the field effect transistor 44 cut off or out of conduction. Since the field effect transistor 44 cannot conduct when the capacitor 41 has a voltage as shown, and the conductor 53 is positive with respect to conductor 37, the charge on the capacitor 50 flows through the pair of diodes 56 and 57 through the resistors 62 to generate a gating pulse at the gate 60 of the silicon controlled rectifier 61. The conduction of the silicon controlled rectifier 61 pulls the relay 64 into an energized state and it is held in an energized state on the next half cycle by the free wheeling diode 70. To this point the normal operation of the system has been described with water available at the probe 21 and with the test switch 32 open. Under the normal operating conditions, the relay contact 65 would be closed to supply power to a burner and the alarm contact 66 would be open indicating that normal operation existed.

With the conditions just described, it is impossible to tell whether the amplifier means 55 has been operating normally or if some type of a failure has occurred in the amplifier means 55 which would cause the conduction of the silicon controlled rectifier 61. Also, there is no determination at this point that the resistance 22 of the probe 21 is not in fact a ground of the probe element P to the boiler or associated structure G. This can happen due to the failure of an initial installation, water surges which bend the probe, etc. The operation of the test switch means will now be described.

It will be first assumed that the probe is properly installed and that the boiler water is providing a resistance value 22 which is in excess of 10 ohms. The depression of the test switch 32 connects the resistance 33 directly in series with the resistance 22 across the potential on conductors 16 and 17. Since the resistance 33 is quite small, in the order of 4 ohms in this specific example, the voltage dropped across the resistance 33 is relatively small compared to the voltage dropped across the resistance of the water 22. This relatively small voltage pulls down the voltage on the gate 45 of the field effect transistor 44. If the entire system is normal, a pulling down of the voltage at gate 45 will cause the capacitor 50 to discharge through the field effect transistor causing the silicon controlled rectifier 61 to cease conducting. This will drop the relay 64 out of the circuit and the alarm contact 66 will close. This tells the installer or maintenance person that the system is working properly. If upon depressing the switch 32, the relay does not drop out, the installer knows that there has been a failure in the amplifier means 55 which causes the silicon controlled rectifier 61 to act as a conductor thereby holding the relay 64 in an energized state.

If the system has been operating in an apparently normal manner, the apparently normal operation could be caused by a short of the probe P to the ground G. This can be detected by the operation of the test switch 32 which would normally cause the relay 64 to drop out. The failure of the relay 64 to drop out means that the resistance between the terminals P and G or the resistance 22 is less than the desired level of 10 ohms and is for all practical purposes a short circuit.

The present circuitry adds another function which is desirable to avoid nuisance indications of fault when the water is near the end of the probe P and any type of a ripple or surge occurs in the boiler which would momentarily break the contact of water between the probe P and ground G. This is accomplished by the resistor 42 and the capacitor 41 wherein the capacitor and resistor 42 provide a slight time delay in the operation of the field effect transistor 44. This slight time delay prevents nuisance alarms or shut downs of the system when the water level is just at the tip of the probe P and some type of a disturbance momentarily breaks the circuit between the ground G and the probe P thereby changing the resistance 22. The amount of the time delay can be readily selected by the size of the capacitor 41 and the size of the resistor 42.

The present invention has been described as a boiler water level control system wherein amplifier means is provided that has a threshold operation level that is above the amount of voltage available when a test switch means is operated pulling the input to the amplifier means down below the threshold level. One specific probe configuration and one specific amplifier configuration has been disclosed. The type of probe and the type of amplifier could be could be readily altered to accomplish the end result detailed in the present specification. It is apparent that one skilled in the art could make many changes in the electronics while utilizing the principle involved. For that reason, the applicant wishes to be limited in the scope of his invention solely by the scope of the appended claims.

The embodiments of the invention in which an exclusive property or fight is claimed are defined as follows:

1. A control circuit having safety test functions adapted to be connected to fluid level detector means, including: amplifier means having a threshold operating level and including amplifier input means and switched output means; power source means to provide electrical power to said amplifier means and to said fluid level detector means; said power source for said detector means being of a magnitude to exceed said threshold operating level when said fluid level detector means is operational to detect a sensed fluid; and test switch means having impedance means connected to said amplifier input means with said test switch means being operable to place said impedance means across said amplifier input means to reduce a signal to said amplifier input means below said threshold level; said test switch means operation also placing said impedance in series with said fluid level detector means and said power source means; said impedance means being large enough to avoid effectively short circuiting said amplifier input means while being smaller than an impedance sensed by said fluid level detector means.

2. A control circuit having safety test functions as described in claim 1 wherein said impedance means includes a resistor that is smaller than the resistance of the fluid to be detected by said fluid level detector means.

3. A control circuit having safety test functions as described in claim 2 wherein said amplifier switched output means includes a relay to control a process to which said fluid level detector means responds.

4. A control circuit having safety test functions as described in claim 3 wherein said fluid level detector means is a boiler water level detector and said process includes fuel burner control means.

5. A control circuit having safety test functions as described in claim 4 wherein said relay includes normally open and normally closed contacts; said contacts operating said fuel burner control means and alarm means.

6. A control circuit having safety test functions as described in claim 2 wherein said amplifier input means includes a field effect transistor; and said output means includes a silicon controlled rectifier and a relay.

7. A control circuit having safety test functions as described in claim 6 wherein said field effect transistor has a gate and a drain as part of said input means; said input means further including a capacitor to provide bias means for said amplifier means.

8. A control circuit having safety test functions as described in claim 4 wherein said boiler water level detector is a boiler water probe having three conductive paths; a first of said paths defining a normal path to detect water; a second and a third of said paths to detect fault paths at said probe; and said first of said paths connected to said power source means and said amplifier input means to cause said amplifier means to respond to the presence of boiler water.

9. A control circuit having safety test functions as described in claim 8 wherein said second and said third paths are connected across said test switch means to shunt said test switch means in the event that either said second or said third paths develops a fault when boiler water is present at said boiler water probe.

10. A control circuit having safety test functions as described in claim 9 wherein said relay includes normally open and normally closed contacts; said contacts operating said fuel burner control means and alarm means.

11. A control circuit having safety test functions as described in claim 10 wherein said amplifier input means includes a field effect transistor; and said output means includes a silicon controlled rectifier and said relay.

12. A control circuit having safety test functions as described in claim 11 wherein said field effect transistor has a gate and a drain as part of said input means; said input means further including a capacitor to provide bias means for said amplifier means.

* * * * *